(12) United States Patent
Stempfhuber et al.

(10) Patent No.: US 11,466,356 B2
(45) Date of Patent: Oct. 11, 2022

(54) OPTICAL ELEMENT HAVING METALLIC SEED LAYER AND ALUMINUM LAYER, AND METHOD FOR PRODUCING SAME

(71) Applicants: Fraunhofer-Gesellschaft zur Förderung der angewandten Forschung e. V., Munich (DE); Friedrich-Schiller-Universität Jena, Jena (DE)

(72) Inventors: Sven Stempfhuber, Jena (DE); Dieter Gäbler, Jena (DE); Paul Schmitt, Jena (DE); Peter Munzert, Jena (DE); Stefan Schwinde, Jena (DE)

(73) Assignees: Fraunhofer-Gesellschaft zur Förderung der angewandten Forschung e. V., Munich (DE); Friedrich-Schiller-Universität Jena, Jena (DE)

( * ) Notice: Subject to any disclaimer, the term of this patent is extended or adjusted under 35 U.S.C. 154(b) by 0 days.

(21) Appl. No.: 16/994,526

(22) Filed: Aug. 14, 2020

(65) Prior Publication Data
US 2021/0047719 A1 Feb. 18, 2021

(30) Foreign Application Priority Data

Aug. 16, 2019 (DE) .......................... 102019122078.5

(51) Int. Cl.
*C23C 14/02* (2006.01)
*C23C 14/16* (2006.01)
(Continued)

(52) U.S. Cl.
CPC .......... *C23C 14/025* (2013.01); *C23C 14/021* (2013.01); *C23C 14/14* (2013.01);
(Continued)

(58) Field of Classification Search
CPC .......... G02B 1/14; G02B 5/08; G02B 5/0808; G02B 5/0891; C23C 14/021;
(Continued)

(56) References Cited

U.S. PATENT DOCUMENTS 6,078,425 A * 6/2000 Wolfe ...................... G02B 1/14
359/884
2011/0134514 A1 6/2011 Weibezahn et al.
(Continued)

FOREIGN PATENT DOCUMENTS

DE 2949104 A1 6/1980
DE 69026783 T2 11/1996
(Continued)

OTHER PUBLICATIONS

Dymshits, Y. I. et al.: "Effect of Heating on the Reflectivity of Aluminum Coatings in the Vacuum Ultraviolet", Sov. J. Opt. Technol. 46,(1979), pp. 649-651.
(Continued)

*Primary Examiner* — Ryan S Dunning
(74) *Attorney, Agent, or Firm* — Haynes Beffel & Wolfeld LLP; Andrew Dunlap

(57) ABSTRACT

A method for producing an aluminum layer is provided. The method includes depositing a metallic seed layer on a substrate, the seed layer having a thickness of not more than 5 nm, and also includes applying the aluminum layer to the seed layer, wherein the aluminum layer has a thickness of more than 30 nm. Further, an optical element, which can be a mirror layer, is provided including the metallic seed layer and the aluminum layer.

18 Claims, 3 Drawing Sheets

(51) Int. Cl.
C23C 14/58 (2006.01)
G02B 1/14 (2015.01)
G02B 5/08 (2006.01)
C23C 14/14 (2006.01)
C23C 14/30 (2006.01)

(52) U.S. Cl.
CPC .............. *C23C 14/16* (2013.01); *C23C 14/30* (2013.01); *C23C 14/58* (2013.01); *G02B 1/14* (2015.01); *G02B 5/08* (2013.01); *G02B 5/0808* (2013.01); *G02B 5/0891* (2013.01)

(58) Field of Classification Search
CPC ....... C23C 14/025; C23C 14/14; C23C 14/16; C23C 14/30; C23C 14/58
See application file for complete search history.

(56) References Cited

U.S. PATENT DOCUMENTS

| | | | |
|---|---|---|---|
| 2013/0170056 A1* | 7/2013 | Ekstein | G21K 1/06 359/838 |
| 2015/0191815 A1 | 7/2015 | Ding et al. | |
| 2015/0293275 A1* | 10/2015 | Crifasi | C23C 14/35 428/673 |
| 2017/0315276 A1 | 11/2017 | Dasbach | |

FOREIGN PATENT DOCUMENTS

| | | | |
|---|---|---|---|
| EP | 0799903 A2 | 10/1997 | |
| WO | WO-0044527 A2 * | 8/2000 | ........... B24B 13/015 |

OTHER PUBLICATIONS

Hutcheson, et al., "Effect of Deposition Rate and Substrate Temperature on the Vacuum Ultraviolet Reflectance of MgF2 and LiF Overcoated Aluminum Mirrors" Applied Optics, vol. 11, No. 10, Oct. 1, 1972, pp. 2245-2248.
Larruquert, J. I. et al., "Far ultraviolet optical properties of MgF2 films deposited by ion-beam sputtering and their application as protective coatings for Al", Optics Communications vol. 215, Jan. 1, 2003, pp. 93-99.
Rodriguez De Marcos, L. V. et al., "Optimization of MgF2-deposition temperature for far UV Al mirrors", Optics EXPRESS, vol. 26, No. 7, Apr. 2, 2018, pp. 9363-9372.
Quijada, M. A. et al., "Enhanced MgF2 and LiF over-coated Al mirrors for FUV space astronomy", Proc of SPIE, vol. 8450, Modem Technologies in Space- and Ground-based Telescopes and Instrumentation II, 84502H (Sep. 13, 2012); doi: 10.1117/12.925579, 10 pgs.
EP 20187203.3—Extended Seach Report dated Jan. 13, 2021, 7 pages.

* cited by examiner

OPTICAL ELEMENT HAVING METALLIC SEED LAYER AND ALUMINUM LAYER, AND METHOD FOR PRODUCING SAME

CROSS-REFERENCE

This application claims the benefit of and priority to German Application No. 102019122078.5 filed 16 Aug. 2019. The priority application is incorporated by reference herein.

BRIEF DESCRIPTION

The invention relates to a method for producing an aluminum layer, which can be provided in particular as a mirror layer in an optical element, and to an optical element comprising the aluminum layer.

Aluminum as a material for reflectors is mainly used in the UV range, since aluminum has a high reflection for this wavelength range. In order to achieve this high reflection, the purest possible aluminum layers without impurities are required, which can be achieved by increased deposition rates, for example. However, a higher deposition rate of aluminum can lead to an increased surface roughness of the aluminum layer.

To avoid reflection losses due to oxidation of the aluminum layer, the aluminum is covered with protective layers containing fluorine. For this purpose, the aluminum is usually applied to the substrate at room temperature and immediately afterwards covered with a thin protective layer. The substrate is then heated to a higher temperature, as the fluorine-containing layers grow denser at higher deposition temperatures. However, at temperatures T>100° C. a restructuring of the aluminum takes place, which can also lead to an increase in surface roughness. In addition, the heating can cause holes in the aluminum layer.

An object to be solved is therefore to specify a method for producing an aluminum layer with which an aluminum layer with low roughness can be produced, which does not increase significantly even at elevated temperatures. Furthermore, an optical element with such an aluminum layer is to be specified.

According to at least one embodiment, the method involves applying a thin metallic seed layer to a substrate, the seed layer having a thickness of no more than 5 nm. In the method, after producing the seed layer, the aluminum layer is applied to the seed layer. The aluminum layer has a thickness of at least 30 nm. It has been found that an aluminum layer with very low roughness can be produced in this way. In particular, the seed layer is completely overgrown by the aluminum layer, resulting in an aluminum layer with a flat surface.

The invention makes particular use of the idea that the growth of the aluminum layer can be influenced by the prior application of the seed layer. In particular, a modified crystalline structure of the aluminum is achieved with the method described here. This leads to the fact that an aluminum layer with a lower surface roughness can be produced. When deposited on the seed layer, the aluminum layer can be in particular polycrystalline, with a proportion of crystallites in orientation greater than when the aluminum layer is deposited directly on the substrate. It is assumed that the changed crystal structure of the polycrystalline aluminum causes the reduced surface roughness when deposited on the metallic seed layer.

It has turned out that the thickness of the seed layer is critical for the surface roughness of the aluminum layer. Preferably, the thickness of the seed layer is 2 nm to 5 nm. A particularly low surface roughness can be achieved if the seed layer has a thickness of 2.5 nm to 3.5 nm.

With a preferred embodiment, the seed layer comprises Cu, Ti, Fe, Zn or Cr. Seed layers of these metals are advantageously suited to bring about the desired modification of the crystalline structure when the aluminum layer is grown, which reduces the roughness of the aluminum layer.

With this method it is advantageous to achieve an rms (root mean square) surface roughness of less than 0.7 nm for the aluminum layer. Preferably the surface roughness is even less than 0.4 nm. This is particularly advantageous when the aluminum layer is used as a mirror layer, since low surface roughness results in high reflection.

In a preferred embodiment of the method, a protective layer is applied to the aluminum layer, wherein the protective layer has a thickness of no more than 5 nm. It has been found that due to the low surface roughness of the aluminum layer achieved by the method, even a comparatively thin protective layer with a thickness of, in particular, no more than 5 nm is sufficient to protect the aluminum layer sufficiently from environmental influences. The protective layer is preferably a metal fluoride layer, especially preferably a MgF2 layer.

In a preferred embodiment of the method, the substrate is cleaned by means of a plasma treatment before the application of the seed layer. The plasma treatment can include etching the substrate.

An optical element that can be produced with the method is also specified. The optical element comprises a substrate, a metallic seed layer disposed on the substrate and an aluminum layer disposed over the seed layer. In particular, the aluminum layer is arranged directly on the seed layer. The metallic seed layer is a layer not more than 5 nm thick. Preferred materials for the seed layer are Cu, Ti, Fe, Zn or Cr.

The aluminum layer is at least 30 nm thick and can be used especially as a mirror layer. Preferably, the aluminum layer is between 30 nm and 100 nm thick. The rms surface roughness of the mirror layer is preferably less than 0.7 nm, especially preferably less than 0.4 nm.

The optical element is preferably a mirror. In particular, the optical element can be a mirror for the UV range.

The advantageous configurations described for the method also apply to the optical element and vice versa.

The invention is explained in more detail below on the basis of exemplary embodiments in connection with FIGS. 1A, 1B, 1C, 1D and 2.

DETAILED DESCRIPTION

Similar or similarly acting components are marked with the same reference signs in the figures. The components shown and the proportions of the components to each other are not to be regarded as true to scale.

Figure 1A:
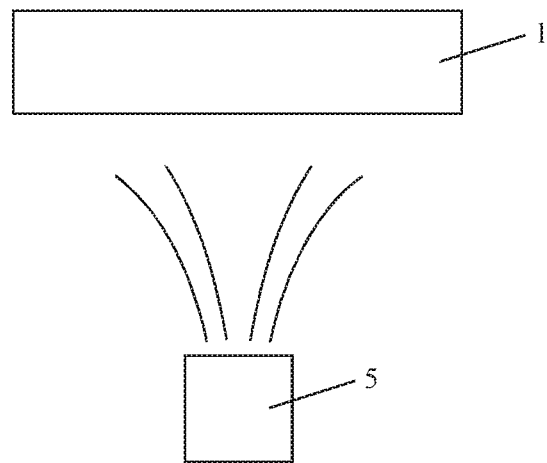
FIGS. 1A, 1B, 1C and 1D show an example of the method for producing an aluminum layer by means of intermediate steps.

In the optional intermediate step of the method shown schematically in FIG. 1A, a substrate 1 to be coated is plasma pretreated. In particular, the substrate 1 can be the basic body of an optical element. For example, the substrate 1 can be a glass, a glass ceramic, a semiconductor material or a metal and can have a flat or curved surface. The substrate 1 is, for example, introduced into the recipient of a coating system and a vacuum is created in the recipient by pumping out, in particular a vacuum with a residual gas pressure of less than 10-4 mbar. The plasma pretreatment and the further steps described below are preferably carried out at a substrate temperature T≥60° C. The plasma pretreatment can be carried out with a plasma source 5, with which, for example, argon ions are accelerated in the direction of substrate 1. For example, plasma source 5 is operated with a bias voltage of 125 V, whereby the bias voltage determines the energy of the ions impinging on the substrate 1. For example, the duration of the plasma treatment is 300 seconds. In the plasma pretreatment, the substrate 1 is cleaned by ion bombardment and/or etched at the surface.

Figure 1B:
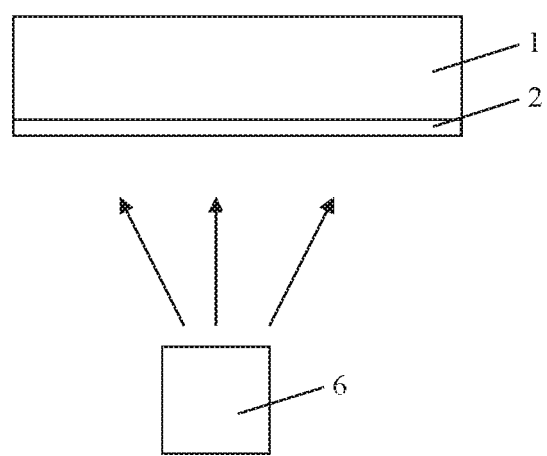

After the optional plasma pretreatment, a vacuum of less than 1*10-5 mbar is advantageously created in the recipient. Subsequently, as shown schematically in FIG. 1B, a seed layer 2 is applied to substrate 1. The seed layer 2 is applied to the substrate by a PVD (physical vapor deposition) method, preferably by evaporation from an electron beam evaporation source 6. The seed layer 2 is a thin metal layer with a thickness of no more than 5 nm. The preferred thickness of the seed layer 2 is between 2 nm and 5 nm, and particularly preferred between 2.5 nm and 3.5 nm. The seed layer 2 preferably comprises one of the metals Cu, Ti, Fe, Zn or Cr.

Figure 1C:
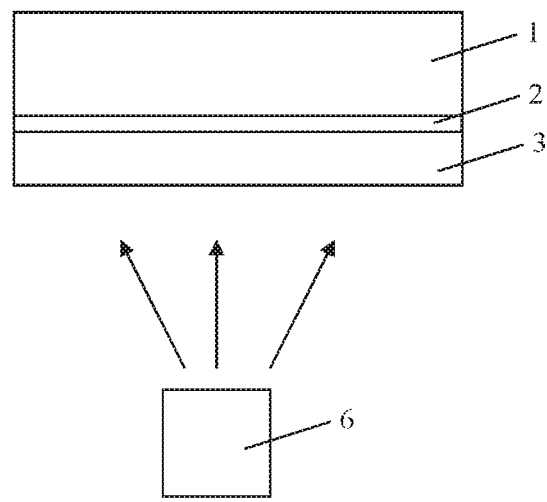

In a subsequent step, which is shown schematically in FIG. 1C, an aluminum layer 3 is applied to the seed layer 2. The vacuum is not interrupted between the application of the seed layer 2 and the application of the aluminum layer 3, whereby the residual gas pressure is preferably less than 1*10-5 mbar. The application of the aluminum layer 3 can again be carried out by a PVD method, for example by evaporation from an electron beam evaporation source 6. The aluminum layer 3 is applied with a layer thickness of at least 30 nm. The deposition rate when applying the aluminum layer 3 is preferably at least 20 nm/s.

In this method, the application of the seed layer 2 before the application of the aluminum layer 3 results in the aluminum layer having a particularly low surface roughness.

An aluminum layer 3 produced with the method described herein was measured with an atomic force microscope and has an rms surface roughness of only 0.38 nm. In contrast, an aluminum layer produced for comparison without the prior application of a seed layer has an rms surface roughness of 1.2 nm. Furthermore, the surface roughness of the aluminum layer 3 produced with the method and the aluminum layer produced for comparison was examined with an atomic force microscope after a temperature treatment at T=225° C. for t=180 s. After temperature treatment, the surface roughness of the aluminum layer produced with the method described herein is 0.36 nm and that of the aluminum layer produced for comparison is 1.86 nm. It can thus be seen that the aluminum layer produced by the method has a much lower surface roughness not only after production but also after temperature treatment than the aluminum layer produced without a seed layer for comparison.

Figure 1D:
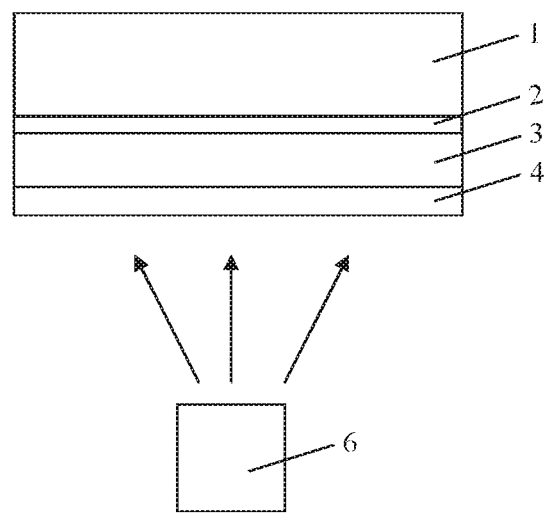

In an optional method step, shown schematically in FIG. 1D, a protective layer 4 has been applied to the aluminum layer 3. The purpose of the protective layer 4 is to protect the aluminum layer 3 from environmental influences, especially from moisture. For this purpose, the protective layer 4 may contain a metal fluoride, preferably MgF2, and is preferably not more than 5 nm thick.

Figure 2:
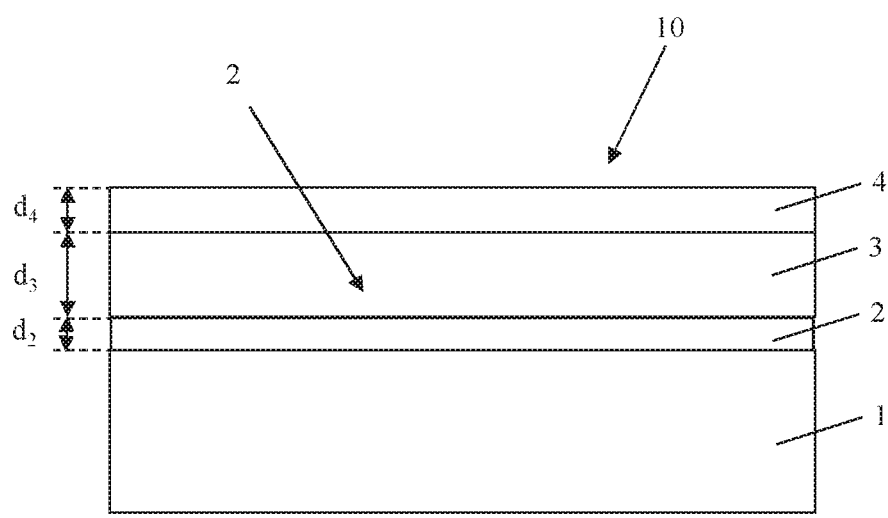
FIG. 2 shows an example of an optical element with the aluminum layer.

An optical element 10 which can be produced in this way by the method described herein is shown in FIG. 2. The optical element comprises a substrate 1, a metallic seed layer 2 disposed on the substrate, and an aluminum layer 3 disposed on the seed layer 2. Furthermore, an optional protective layer 4 can be arranged on the aluminum layer 3. The seed layer 2 has a thickness d2≤5 nm. Preferably 2 nm≤d2≤5 nm, particularly preferably 2.5 nm≤d2≤3.5 nm. The material of the seed layer is preferably one of the metals Cu, Ti, Fe, Zn or Cr. The aluminum layer 3 arranged above the seed layer has a thickness d3 of at least 30 nm, preferably a thickness d3 of 30 nm to 100 nm. The aluminum layer 3 is characterized in particular by a surface roughness of only less than 0.7 nm, preferably less than 0.4 nm. It has been found that due to the low surface roughness of the aluminum layer 3, a comparatively thin protective layer 4 is sufficient to protect the aluminum layer 3 sufficiently from environmental influences. The protective layer 4 preferably has a thickness d4 of no more than 5 nm.

The optical element 10, for example, is a mirror, especially a mirror for the UV spectral range. The mirror can be a flat or curved mirror.

The invention is not limited by the description based on the exemplary embodiments. Rather, the invention comprises any new feature as well as any combination of features, which includes in particular any combination of features in the claims, even if that feature or combination is not itself explicitly mentioned in the claims or exemplary embodiments.

The invention claimed is:

1. A method for producing an optical element including a substrate, a metallic seed layer on the substrate and an aluminum layer deposited on a side of the metallic seed layer that faces away from the substrate, wherein the aluminum layer directly adjoins the metallic seed layer and the aluminum layer has a root mean square roughness of less than 0.7 nm, the method comprising:
  depositing the metallic seed layer on the substrate, the metallic seed layer having a thickness of not more than 5 nm; and
  applying the aluminum layer directly to the metallic seed layer, wherein the aluminum layer has a thickness of 30 nm to 100 nm inclusive.

2. The method according to claim 1, wherein the metallic seed layer comprises Cu, Ti, Fe, Zn or Cr.

3. The method according to claim 1, wherein the metallic seed layer is between 2 nm and 5 nm thick.

4. The method according to claim 1, wherein the metallic seed layer is between 2.5 nm and 3.5 nm thick.

5. The method according to claim 1, wherein the aluminum layer has a root mean square surface roughness of less than 0.4 nm.

6. The method according to claim 1, further comprising applying a protective layer to the aluminum layer, wherein the protective layer has a thickness of not more than 5 nm.

7. An optical element comprising:
  a substrate;
  a metallic seed layer on the substrate, the metallic seed layer having a thickness of not more than 5 nm; and
  an aluminum layer disposed on a side of the metallic seed layer that faces away from the substrate,
  wherein the aluminum layer directly adjoins the metallic seed layer,
  wherein the aluminum layer has a thickness of 30 nm to 100 nm inclusive, and
  wherein the aluminum layer has a root mean square roughness of less than 0.7 nm.

8. The optical element according to claim 7, wherein the metallic seed layer comprises Cu, Ti, Fe, Zn or Cr.

9. The optical element according to claim 7, wherein the optical element is a mirror, and wherein the aluminum layer is a mirror layer.

10. The optical element according to claim 7, wherein the metallic seed layer is between 2 nm and 5 nm thick.

11. The optical element according to claim 7, wherein the metallic seed layer is between 2.5 nm and 3.5 nm thick.

12. The optical element according to claim 7, wherein the aluminum layer has a root mean square surface roughness of less than 0.4 nm.

13. The optical element according to claim 7, further comprising a protective layer disposed on the aluminum layer, wherein the protective layer has a thickness of not more than 5 nm.

14. An optical element comprising:
   a substrate;
   a metallic seed layer on the substrate, the metallic seed layer having a thickness of not more than 5 nm; and
   an aluminum layer disposed on a side of the metallic seed layer that faces away from the substrate,
   wherein the aluminum layer directly adjoins the metallic seed layer,
   wherein the aluminum layer has a thickness of more than 30 nm,
   wherein the metallic seed layer is between 2.5 nm and 3.5 nm thick, and
   wherein all layers of the optical element are arranged on a same side of the substrate.

15. The optical element of claim 14, wherein the metallic seed layer comprises Cu, Ti, Fe, Zn or Cr.

16. The optical element of claim 14, wherein the optical element is a mirror, and wherein the aluminum layer is a mirror layer.

17. The optical element of claim 14, further comprising a protective layer disposed on the aluminum layer, wherein the protective layer has a thickness of not more than 5 nm.

18. The optical element of claim 14, wherein the aluminum layer has a root mean square surface roughness of less than 0.4 nm.

* * * * *